United States Patent
Lee et al.

(10) Patent No.: US 9,412,973 B2
(45) Date of Patent: Aug. 9, 2016

(54) ORGANIC LIGHT EMITTING DIODE DISPLAY DEVICE AND METHOD OF FABRICATING THE SAME

(71) Applicant: LG DISPLAY CO., LTD., Seoul (KR)

(72) Inventors: Kang-Ju Lee, Goyang-Si (KR); Soo-Kang Kim, Paju-Si (KR); Yeon-Suk Kang, Busan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/539,860

(22) Filed: Nov. 12, 2014

(65) Prior Publication Data
US 2015/0129857 A1 May 14, 2015

(30) Foreign Application Priority Data
Nov. 13, 2013 (KR) .................... 10-2013-0137459

(51) Int. Cl.
| H01L 21/00 | (2006.01) |
| H01L 29/08 | (2006.01) |
| H01L 35/24 | (2006.01) |
| H01L 51/00 | (2006.01) |
| H01L 51/52 | (2006.01) |
| H01L 27/32 | (2006.01) |

(52) U.S. Cl.
CPC ........ *H01L 51/5268* (2013.01); *H01L 27/3258* (2013.01); *H01L 51/5206* (2013.01)

(58) Field of Classification Search
CPC . H01L 51/56; H01L 51/5012; H01L 51/0072; H01L 27/3244
USPC ......................................... 438/29–32; 257/40
See application file for complete search history.

(56) References Cited

U.S. PATENT DOCUMENTS

| 2002/0039001 A1* | 4/2002 | Nagai et al. .................... 313/512 |
| 2004/0106221 A1* | 6/2004 | Hunter et al. .................... 438/21 |
| 2006/0244370 A1* | 11/2006 | Tyan et al. .................... 313/506 |
| 2010/0200845 A1* | 8/2010 | Jeong et al. .................... 257/40 |
| 2013/0105770 A1* | 5/2013 | Pschenitzka .................... 257/40 |

* cited by examiner

*Primary Examiner* — Calvin Choi
(74) *Attorney, Agent, or Firm* — Birch, Stewart, Kolasch & Birch, LLP

(57) ABSTRACT

An organic light emitting diode display device which may improve luminous emitting efficiency by forming a scattering layer with a material including fluorine and a method of fabricating the same are discussed. The organic light emitting diode display device can include a thin film transistor formed on a substrate; an overcoat layer formed on the substrate such that the thin film transistor is covered; a scattering layer formed on the overcoat layer and formed with a material including fluorine; and an organic light emitting cell formed on the scattering layer and including a first electrode, an organic emission layer and a second electrode sequentially laminated, wherein light emitted from the organic light emitting cell passes through the scattering layer and then is emitted through the substrate.

17 Claims, 5 Drawing Sheets

ORGANIC LIGHT EMITTING DIODE DISPLAY DEVICE AND METHOD OF FABRICATING THE SAME

This application claims the benefit of Korean Patent Application No. 10-2013-0137459, filed on Nov. 13, 2013, which is hereby incorporated by reference as if fully set forth herein.

BACKGROUND OF THE INVENTION

1. Field of the Invention

The present invention relates to an organic light emitting diode display device which may improve luminous efficiency and lifespan by use of a scattering layer, and a method of fabricating the same.

2. Discussion of the Related Art

Image display devices, which display a variety of information on a screen, are a core technology of information and communication and are becoming increasingly thinner, lighter, more portable and higher performance. By pursuing extensity and convenience, flexible displays are required and thereby organic light emitting diode display devices controlling the light emitting amount of an organic emission layer are receiving attention recently.

Organic light emitting diode display devices include a substrate in which a thin film transistor (TFT) is formed, an organic light emitting device formed on the substrate and an encapsulation layer formed such that an organic light emitting display device is surrounded. The thin film transistor is formed in each of a plurality of sub-pixel regions defined by gate lines and date lines cross-formed on a substrate. The organic light emitting device connects to the thin film transistor formed in each sub-pixel region.

Here, the organic light emitting device includes a first electrode, a second electrode, and an organic emission layer formed between the first electrode and the second electrode. By adding an electric field to the first electrode and second electrode and thereby injecting and transferring electrons and holes recombine the organic emission layer, electrons and holes forming a pair in an organic emission layer emit light while dropping from an excited state to a ground state.

Only 20% of light emitted from the organic emission layer reaches the outside. Accordingly, to improve luminous efficiency, a scattering layer is employed. The scattering layer is generally formed by dispersing scattered particles in a solvent or by growing nanowires. However, when the scattering layer is formed as described above, it is impossible to continuously obtain identical scattering effects. Furthermore, the scattering layer is not suitable for mass production.

SUMMARY OF THE INVENTION

Accordingly, the present invention is directed to an organic light emitting diode display device and method of fabricating the same that substantially obviate one or more problems due to limitations and disadvantages of the related art.

An object of the present invention is to provide an organic light emitting diode display device including a scattering layer including a material including fluorine and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting diode display device comprises: a thin film transistor on a substrate; an overcoat layer on the substrate to cover the thin film transistor; a scattering layer including fluorine on the overcoat layer; and an organic light emitting cell on the scattering layer, comprising a first electrode, an organic emission layer and a second electrode sequentially laminated, wherein light emitted from the organic light emitting cell passes through the scattering layer and is emitted through the substrate. A material of the scattering layer is selected from LiF, CsF and $BeF_2$.

In another aspect of the present invention, a method of fabricating an organic light emitting diode display device includes forming comprising: forming a thin film transistor on a substrate; forming an overcoat layer on the substrate to cover the thin film transistor; forming a scattering layer including fluorine on the overcoat layer; and forming an organic light emitting cell including a first electrode, organic emission layer and second electrode sequentially laminated on the scattering layer, wherein light emitted from the organic light emitting cell passes through the scattering layer and then is emitted through the substrate. Irradiating the scattering layer with ultraviolet light may be further comprised after forming the scattering layer.

Also, forming an optical compensation layer may be further comprised after forming the scattering layer to planarize an upper surface of the scattering layer. In this case, a material forming the optical compensation layer may use an organic material having a refractive index equal to or greater than a refractive index of the first electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the embodiments of the present invention, examples of which are illustrated in the accompanying drawings. Wherever possible, the same reference numbers will be used throughout the drawings to refer to the same or like parts.

Hereinafter, an organic light emitting diode display device according to the present invention and a method of fabricating the same will be described in detail with reference to the accompanying drawings.

Figures 1, 2:
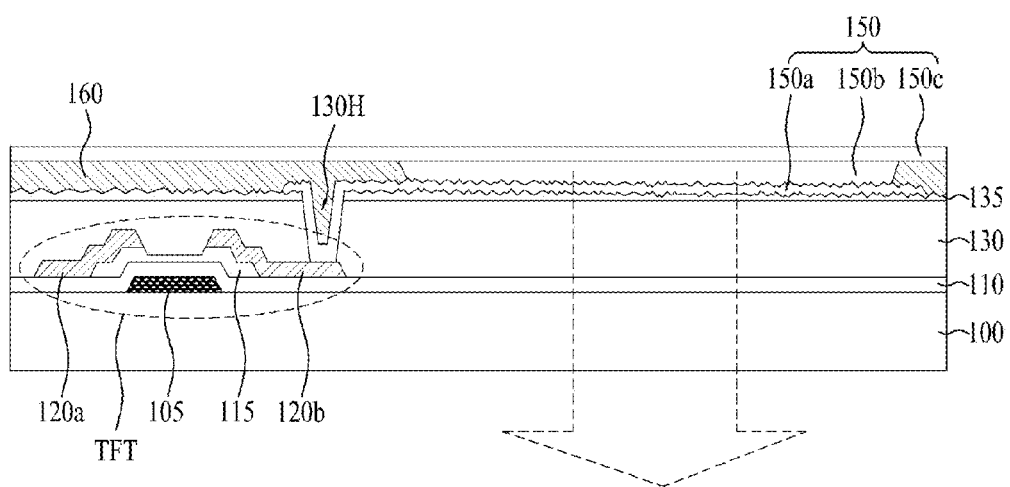
FIG. 1 is a sectional view of an organic light emitting diode display device according to an embodiment of the present invention.
FIG. 2 shows examples of surface images of LiF in accordance with a deposition rate according to an embodiment of the present invention.

FIG. 1 is a sectional view of an organic light emitting diode display device according to an embodiment of the present invention.

As illustrated in FIG. 1, an organic light emitting diode display device according to the present invention includes a substrate 100 in which a thin film transistor (TFT) is formed, an overcoat layer 130 formed to cover the thin film transistor (TFT), a light scattering layer 135 formed on the overcoat layer 130 and an organic light emitting cell 150 formed on the light scattering layer 135. All components of the organic light emitting display device in this and other embodiments are operatively coupled and configured.

In particular, a thin film transistor (TFT) is formed on the substrate 100. In FIG. 1, an amorphous silicon thin film transistor (amorphous silicon TFT) using amorphous silicon as a semiconductor layer 115 is illustrated. However, a thin film transistor may be selected from an oxide thin film transistor (oxide TFT) using an oxide such as indium gallium zinc oxide (IGZO), zinc oxide (ZnO), titanium oxide (TiO) and the like as the semiconductor layer 115, an organic thin film transistor (organic TFT) using an organic material as the semiconductor layer 115, and a polycrystalline silicon thin film transistor (poly silicon TFT) using polycrystalline silicon as the semiconductor layer 115 and the like.

The thin film transistor (TFT) includes a gate electrode 105, a gate insulating film 110, the semiconductor layer 115, a source electrode 120a and a drain electrode 120b. The gate insulating film 110 is disposed between the gate electrode 105 and the semiconductor layer 115, and the semiconductor layer 115 overlaps the gate electrode 105. The source electrode 120a and drain electrode 120b are spaced from each other on the semiconductor layer 115.

The overcoat layer 130 is formed over an overall surface of the substrate 100 such that the thin film transistor (TFT) is covered. The overcoat layer 130 is formed such that the thin film transistor (TFT) is completely covered and thereby an upper surface of the substrate 100 is planarized. Although not shown in the figure, an inorganic protective film may be further formed between the overcoat layer 130 and the thin film transistor TFT.

A scattering layer 135 is provided on the overcoat layer 130. The scattering layer 135 is provided to improve the luminous efficiency of the organic light emitting diode display device by scattering light emitted from the organic light emitting cell 150. As described above, a conventional scattering layer is formed by dispersing scattered particles in a solvent or by growing nanowires. In this case, identical scattering effects may not be obtained thus, such a conventional scattering layer is not suitable for mass production.

Accordingly, the organic light emitting diode display device according to the present invention provides a scattering layer 135 formed with a material including fluorine such as LiF, CsF, $BeF_2$ and the like. When the scattering layer 135 as a material including fluorine is formed by thermal deposition, an upper surface of the scattering layer 135 has an uneven shape and surface roughness changes according to a rate of deposition.

Figure 3:
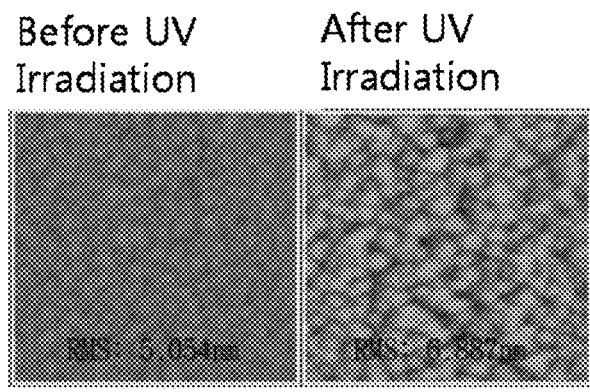
FIG. 3 shows an example of surface images before and after irradiating UV to LiF according to an embodiment of the present invention.

FIG. 2 illustrates surface images of LiF according to a rate of deposition. LiF was formed to a thickness of 3000 Å varying a rate of deposition. FIG. 3 is surface images before and after irradiating UV to LiF.

As illustrated in FIG. 2, when LiF was thermal deposited at a rate of 2 Å/s, a root mean square (RMS) value of surface roughness is 3.104 nm. However, when a deposition rate was elevated to 6 Å/s, RMS value greatly increased to 5.054 nm. Since a scattering degree of light passing through a scattering layer increases with increasing RMS value, an organic light emitting diode display device according to an embodiment of the present invention may improve luminous efficiency without additional increase in power consumption.

Particularly, RMS value of surface roughness may be increased by ultraviolet (UV) irradiation. As illustrated in FIG. 3, by irradiating UV having a wavelength of 265 nm for five minutes, in the scattering layer, RMS value increases from 5.054 nm to 6.887 nm. The phenomenon is caused by materials including fluorine agglomerating each other and thereby particle sizes of the scattering layer 135 are enlarged.

In addition, the thickness of the scattering layer 135 is preferably in a range of 1000 Å to 4000 Å. When the thickness of the scattering layer 135 is too thin, the heights of surface unevenesses of the scattering layer 135 are too low and, as such, the scattering layer 135 does not obtain sufficient scattering effect.

Referring to FIG. 1 again, the organic light emitting cell 150 including a first electrode 150a, an organic light emission layer 150b and a second electrode 150c is formed on the scattering layer 135. In particular, the first electrode 150a electrically connects to the drain electrode 120b exposed through a contact hole. The first electrode 150a is formed with a transparent conductive material such as tin oxide (TO), indium tin oxide (ITO), indium zinc oxide (IZO), indium tin zinc oxide (ITZO) and the like as an anode.

On the first electrode 150a, a bank insulating film 160 having a bank hole exposing a partial area of the first electrode 150a is formed. The bank insulating film 160 prevents light leakage in an area except for a light emitting area. The organic light emission layer 150b is formed in the bank hole and the second electrode 150c is formed on the organic light emission layer 150b. The second electrode 150c is formed with a reflective metal material such as aluminum (Al) as a cathode and reflects light generated from the organic light emission layer 150b in the direction of the substrate 100.

In such organic light emitting devices, when voltage is applied between the first electrode 150a and the second electrode 150c, holes from the first electrode 150a and electrons from the second electrode 150c are injected and recombined in a light emission layer 190b, and thereby excitons are generated. In addition, when excitons drop to a ground state, emitted light passes through the scattering layer 135 in an under part of the organic light emitting cell 150 and then is emitted outside through the substrate 100.

The organic light emitting diode display device according to the present invention forms a scattering layer with a material including fluorine and, as such, luminous efficiency may be improved without additional increase in consumption power. Especially, by further irradiating ultraviolet (UV) after forming the scattering layer, the surface roughness RMS value of the scattering layer may be further increased.

Figure 4:
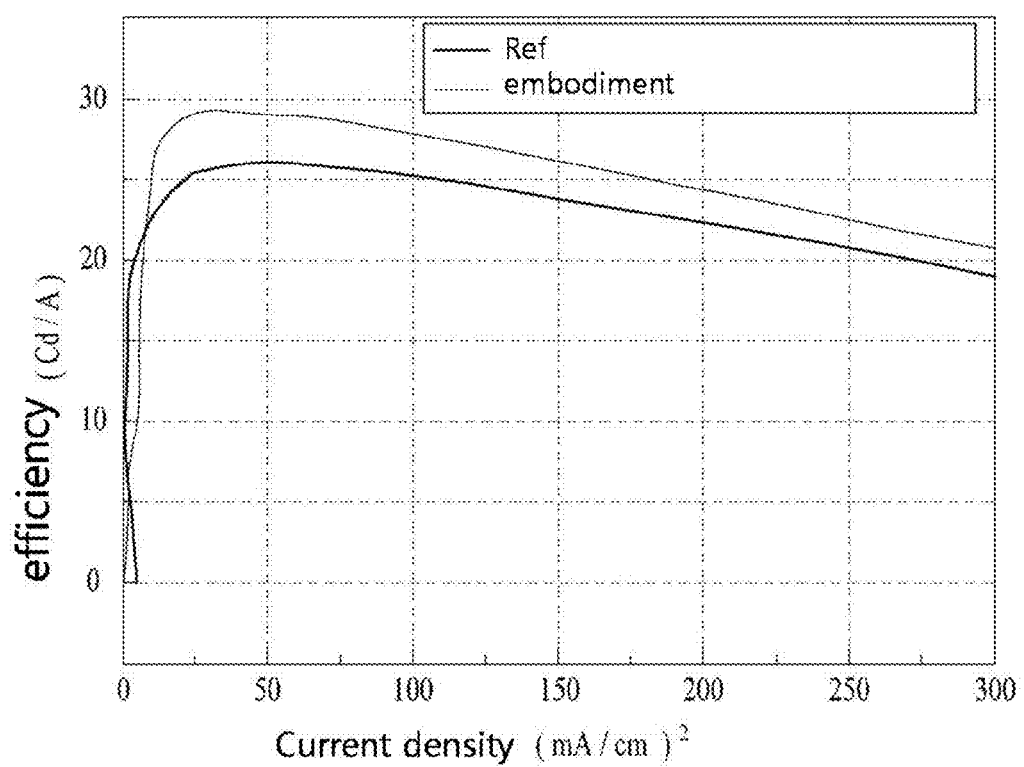
FIG. 4 is a graph illustrating efficiencies of an organic light emitting diode display device as a reference and an organic light emitting diode display device according to an embodiment of the present invention.

FIG. 4 is a graph showing efficiency of an organic light emitting diode display device as a reference and the organic light emitting diode display device according to an embodiment of the present invention. Here, the organic light emitting diode display device of a reference is an organic light emitting diode display device not including a scattering layer. The organic light emitting diode display device according to an embodiment of the present invention is an organic light emitting diode display device having the scattering layer and the scattering layer is LiF formed at a rate of 6 Å/s and has a thickness of 3000 Å.

As illustrated in FIG. 4, the organic light emitting diode display device according to the embodiment of the present invention has higher efficiency under identical current density, when compared to the organic light emitting diode display device of reference. In particular, the efficiency of the organic light emitting diode display device according to the present invention increases up to approximately 16.8% when compared to the organic light emitting diode display device of reference.

Figure 5:
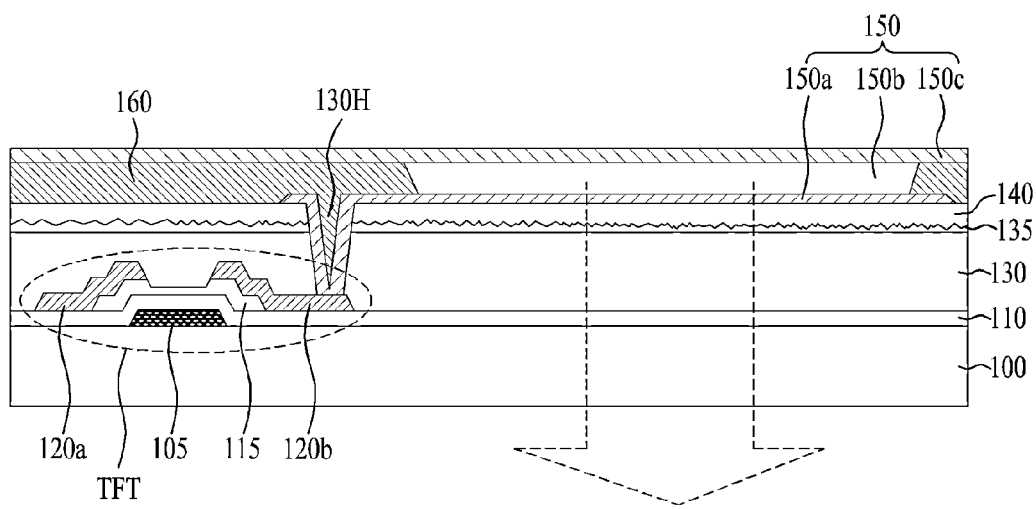
FIG. 5 is a sectional view of an organic light emitting diode display device according to another embodiment of the present invention.

FIG. 5 is a sectional view of an organic light emitting diode display device according to another embodiment of the present invention.

As illustrated in FIG. 5, the organic light emitting diode display device according to another embodiment of the present invention further includes an optical compensation layer 140, which is formed with an organic material, between the scattering layer 135 and the first electrode 150a.

When the optical compensation layer 140 is not provided, light emitted from the organic light emission layer 150b passes through the first electrode 150a and the scattering layer 135, sequentially. By refractive index difference of the scattering layer 135 and the first electrode 150a, light incident on the scattering layer 135 is lost. In addition, the first electrode 150a is directly formed on the scattering layer 135, due to roughness of a surface of the scattering layer 135, the first electrode 150a is not evenly formed on an upper surface of the scattering layer 135. As a result, leakage current, blur or the like may occur and thereby image quality may be deteriorated.

However, to planarize the upper surface of the scattering layer 135, by forming the optical compensation layer 140 on the scattering layer 135 with an organic material and by forming the first electrode 150a on the optical compensation layer 140, the upper surface of the first electrode 150a is formed on the optical compensation layer 140 which is flat and, as such, deterioration of leakage current and image quality as described above may be prevented.

Here, preferably, to prevent total reflection of light proceeding to the optical compensation layer 140 after being emitted from the first electrode 150a, the refractive index of the optical compensation layer 140 is equal to or greater than the refractive index of the first electrode 150a. For example, when the first electrode 150a is formed of indium tin oxide (ITO) having a refractive index of approximately 1.8, the optical compensation layer 140 is preferably formed with an organic material having a refractive index of 1.8 or more.

FIG. 6A to FIG. 6E are sectional views illustrating a method of fabricating the organic light emitting diode display device according to the present invention.

Figure 6A:
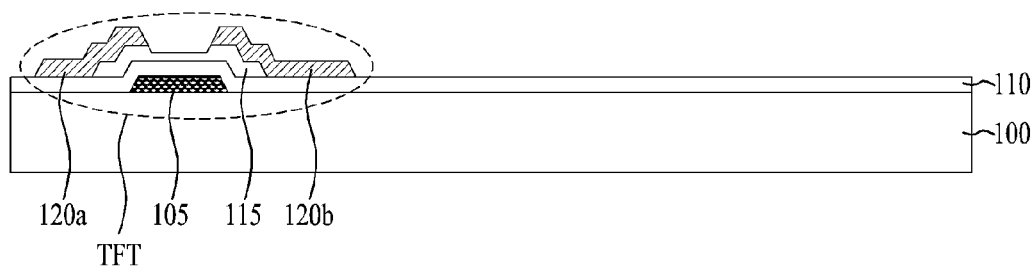
FIGS. 6A to 6E are sectional views of processes illustrating a method of fabricating an organic light emitting diode display device according to an embodiment of the present invention.

As illustrated in FIG. 6A, a thin film transistor is formed on the substrate 100. The thin film transistor (TFT) is formed in each sub-pixel region defined by gate lines and data lines which intersect. The thin film transistor (TFT) includes the gate electrode 105, the gate insulating film 110, the semiconductor layer 115, the source electrode 120a and the drain electrode 120b.

Figure 6B:
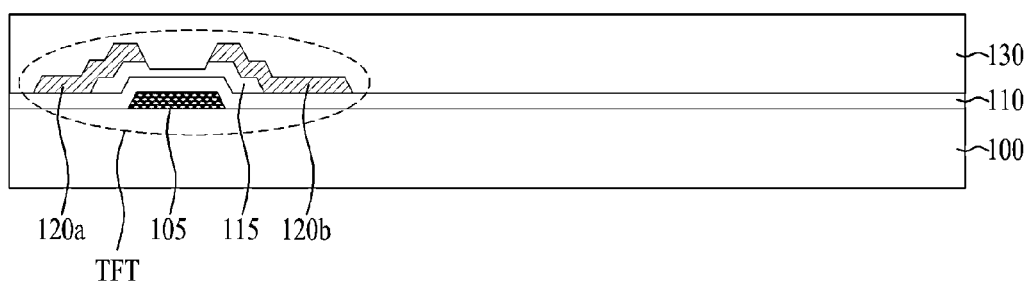

Next, as illustrated in FIG. 6B, the overcoat layer 130 is formed over an overall surface of the substrate such that the thin film transistor (TFT) is surrounded. The overcoat layer 130 is formed such that the thin film transistor (TFT) is completely covered and thereby the upper surface of the substrate 100 is planarized. Although not shown in the figure, an inorganic protective film may be further formed between the overcoat layer 130 and the thin film transistor (TFT).

Figure 6C:
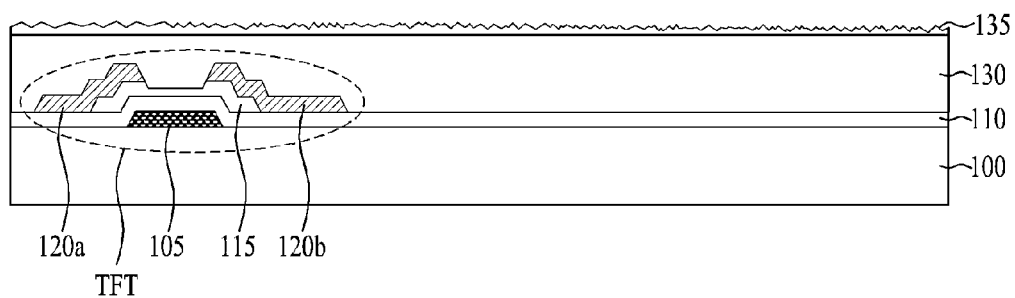

In addition, as illustrated in FIG. 6C, the scattering layer 135 is formed on the overcoat layer 130. The scattering layer 135 scatters light emitted from the organic light emitting cell 150 to improve luminous efficiency of the organic light emitting diode display device.

The scattering layer 135 is formed with a material including fluorine by thermal deposition. Here, surface roughness of the material including fluorine is varied according to a deposition rate. Therefore, the deposition rate of the scattering layer 135 is preferably 6 Å/s or more such that the scattering layer 135 has sufficient scattering effect. In addition, the thickness of the scattering layer 135 is preferably in a range of 1000 Å to 4000 Å such that the scattering layer 135 has sufficient scattering effect.

In addition, the optical compensation layer 140 may be further formed of an organic material over overall surface of the scattering layer 135. Here, as described above, the refractive index of an optical compensation layer is preferably equal to or greater than the refractive index of the first electrode 150a.

Figure 6D:
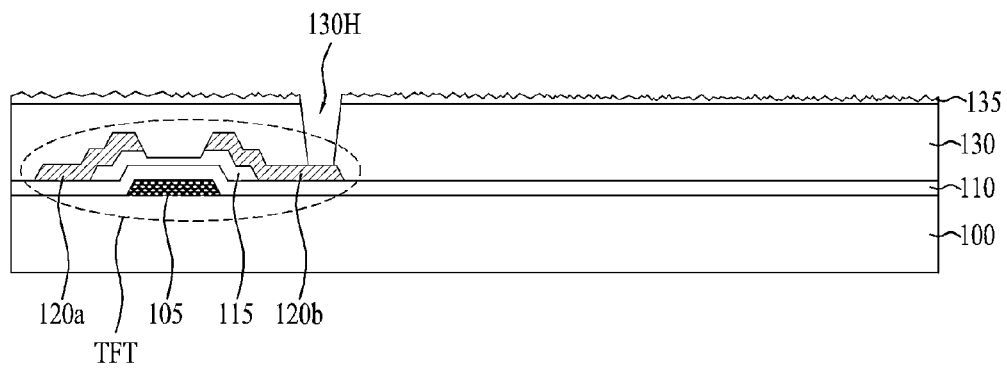

Next, as illustrated in FIG. 6D, by selectively removing the overcoat layer 130 and the scattering layer 135, a drain contact hole 130H exposing the drain electrode 120b of the thin film transistor (TFT) is formed. As described above, when the optical compensation layer 140 is further formed, the drain contact hole 130H is formed by removing the overcoat layer 130, scattering layer 135 and optical compensation layer (not shown).

Figure 6E:
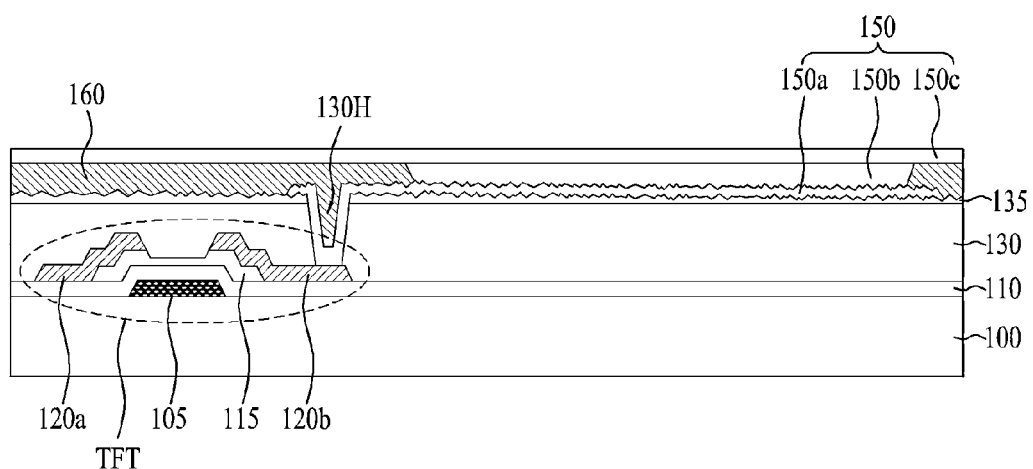

In addition, as illustrated in FIG. 6E, the organic light emitting cell 150 connecting to a thin film transistor (TFT) is formed.

The organic light emitting cell 150 includes the first electrode 150a, organic light emission layer 150b and second electrode 150c which are sequentially laminated. The first electrode 150a connects to the drain electrode 120b through the drain contact hole 130H. The first electrode 150a is formed of a transparent conductive material such as a tin oxide (TO), indium tin oxide (ITO), indium zinc oxide (IZO), indium tin zinc oxide (ITZO) or the like. In addition, the bank insulating film 160 having a bank hole exposing a partial area of the first electrode 150a is formed on the first electrode 150a and defines a light emitting area.

The organic light emission layer 150b is formed on the first electrode 150a exposed through the bank insulating film 160. In addition, the second electrode 150c is formed such that the organic light emission layer 150b is covered. The second electrode 150c is formed of a reflective metal material such as aluminum (Al) as a cathode and reflects white light emitted from the light emission layer 190b in the direction of the first electrode 150a.

A hole injection layer and hole transfer layer may be further formed between the first electrode 150a and the organic light emission layer 150b. In this regard, the hole injection layer and hole transfer layer are provided to easily inject holes into the organic light emission layer 150b. In addition, an electron injection layer and electron transfer layer may be further formed between the organic light emission layer 150b and the second electrode 150c. In the regard, the electron injection layer and electron transfer layer are provided to easily inject electrons into the organic light emission layer 150b. In addition, an encapsulation layer may be formed on the second electrode 150c to prevent external moisture and oxygen from passing through the organic light emitting cell 150.

As described above, the scattering layer 135 of the organic light emitting diode display device according to the present invention can be formed of a material including fluorine to improve luminous efficiency without additional power consumption increase. Especially, by further performing a process irradiating ultraviolet (UV) after forming the scattering layer 135, the surface roughness RMS value of the scattering layer 135 may be further increased.

In addition, to planarize a surface of the scattering layer 135, the optical compensation layer 140 is formed between the scattering layer 135 and the first electrode 150a and thereby a pattern defect of the first electrode 150a may be prevented. In addition, by forming the optical compensation layer 140 of a material having a refractive index equal to or greater than the refractive index of the first electrode 150a, total reflection of light proceeding to the optical compensation layer 140 after being emitted from the first electrode 150a may be prevented.

As is apparent from the foregoing description, an organic light emitting diode display device according to the present invention and a method of fabricating the same can have effects and advantages as follows.

First, luminous efficiency may be improved without additional increase in consumption power by forming a scattering layer with a material including fluorine. Especially, a surface roughness value of the scattering layer is increased and, as such, luminous efficiency may be improved by further performing an ultraviolet (UV) irradiation process after forming the scattering layer.

Second, to planarize the surface of the scattering layer, an optical compensation layer can be formed between the scattering layer and a first electrode, and thereby the first electrode is formed on the optical compensation layer which is flat. As a result, a pattern defect of the first electrode may be prevented.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode display device comprising:
    a thin film transistor on a substrate;
    an overcoat layer on the substrate to cover the thin film transistor;
    a scattering layer including fluoride on the overcoat layer, wherein the scattering layer has an upper surface of an uneven shape to increase scattering degree;
    an optical compensation layer provided directly on the scattering layer to planarize the upper surface of the scattering layer; and
    an organic light emitting cell on the optical compensation layer, the organic light emitting cell including a first electrode, an organic emission layer and a second electrode sequentially laminated,
    wherein light emitted from the organic light emitting cell passes through the scattering layer and is emitted through the substrate.

2. The organic light emitting diode display device according to claim 1, wherein the fluoride is selected from LiF, CsF and BeF2.

3. The organic light emitting diode display device according to claim 1, wherein the scattering layer has a thickness in a range of 1000 Å to 4000 Å.

4. The organic light emitting diode display device according to claim 1, wherein the optical compensation layer includes an organic material.

5. The organic light emitting diode display device according to claim 1, wherein the optical compensation layer has a refractive index equal to or greater than a refractive index of the first electrode.

6. A method of fabricating an organic light emitting diode display device, the method comprising:
    forming a thin film transistor on a substrate;
    forming an overcoat layer on the substrate to cover the thin film transistor;
    thermally depositing a scattering layer with fluoride on the overcoat layer so that the scattering layer has an upper surface of an uneven shape to increase scattering degree;
    forming an optical compensation layer directly on the scattering layer to planarize the upper surface of the scattering layer; and
    forming an organic light emitting cell including a first electrode, an organic emission layer and a second electrode sequentially laminated on the scattering optical compensation layer,
    wherein light emitted from the organic light emitting cell passes through the scattering layer and then is emitted through the substrate.

7. The method according to claim 6, wherein the fluoride is selected from LiF, CsF and BeF2.

8. The method according to claim 6, wherein a deposition rate in the thermal deposition is greater than or equal to 6 Å/s.

9. The method according to claim 6, wherein a thickness of the scattering layer after forming the scattering layer is in a range of 1000 Å to 4000 Å.

10. The method according to claim 6, further comprising irradiating the scattering layer with ultraviolet light after thermally depositing the scattering layer.

11. The method according to claim 6, wherein the optical compensation layer includes an organic material.

12. The method according to claim 6, wherein the optical compensation layer has a refractive index equal to or greater than a refractive index of the first electrode.

13. The method according to claim 6, wherein a surface roughness of the scattering layer changes according to a rate of deposition.

14. The organic light emitting diode display device according to claim 1, wherein the scattering layer has no oxide.

15. The organic light emitting diode display device according to claim 1,
    wherein the scattering layer has a lower surface to be planarized along an upper surface of the overcoat layer, and
    wherein the light emitted from the organic light emitting cell passes from the upper surface to the lower surface of the scattering layer.

16. The organic light emitting diode display device according to claim 4, wherein the organic material of the optical compensation layer has a refractive index of 1.8 or more.

17. An organic light emitting diode display device comprising:
    a thin film transistor on a substrate;
    an overcoat layer on the substrate to cover the thin film transistor;

a scattering layer including fluorine on the overcoat layer, the scattering layer having an uneven surface;

an optical compensation layer provided directly on the scattering layer to planarize the scattering layer; and an organic light emitting cell on the optical compensation layer, and including a first electrode, an organic emission layer and a second electrode sequentially laminated, wherein light emitted from the organic light emitting cell passes through the scattering layer and is emitted through the substrate.

\* \* \* \* \*